US005536619A

United States Patent [19]

Verburgh

[11] Patent Number: 5,536,619

[45] Date of Patent: Jul. 16, 1996

[54] HEAT MODE RECORDING MATERIAL

[75] Inventor: Yves Verburgh, Begijnendijk, Belgium

[73] Assignee: AGFA-Gevaert, N.V., Mortsel, Belgium

[21] Appl. No.: 315,448

[22] Filed: Sep. 30, 1994

[30] Foreign Application Priority Data

Oct. 25, 1993 [EP] European Pat. Off. .............. 93202973

[51] Int. Cl.[6] .............................................. G03F 7/11

[52] U.S. Cl. .................................... 430/273.1; 430/270.1; 430/271.1; 430/272.1; 430/303; 430/944; 430/945; 430/964

[58] Field of Search .................................... 430/200, 202, 430/272, 273, 270, 944, 945, 964, 303

[56] References Cited

U.S. PATENT DOCUMENTS 5,360,781 1/1994 Leenders et al. ........................ 430/200

5,378,580 1/1995 Leenders ................................ 430/945

*Primary Examiner*—John S. Y. Chu

*Attorney, Agent, or Firm*—Breiner & Breiner

[57] ABSTRACT

The present invention provides a heat mode recording material comprising on a transparent support a recording layer containing a light to heat converting substance, an image forming substance and a binder characterised in that there is present a heat decomposable intermediate layer between said transparent support and said recording layer and said heat decomposable intermediate layer being contiguous to said recording layer. High density images practically free of fog are obtained. The images are suitable for use as masks in contact exposures of lithographic printing plate precursors.

6 Claims, No Drawings

HEAT MODE RECORDING MATERIAL

DESCRIPTION

1. Field of the Invention

The present invention relates to a heat mode recording material and to a method for making images therewith. More in particular the present invention relates to an improvement of the quality, i.e. a low minimum density, of an image obtained with a heat mode recording material so that these images can be used as masks in a printing plate making process.

2. Detailed Description of the Invention

In the process for preparing lithographic printing plates contact originals are prepared containing text and graphics. These originals are then used for imaging a printing plate. Such contact originals can be made by manually preparing a paste-up or they can be prepared by the aid of a computer. In the latter case the computer may control an output device, generally a laser, for imaging a recording material.

A particular desirable recording material for imaging a printing plate contains the image on a transparent support allowing the printing plate to be exposed through the support of the recording material. In order to obtain a printing plate having good printing properties it is of particular importance that the minimum density, i.e. the density at the non-image areas, of the image on the recording material is extremely low. Generally it will be required that the minimum density of the image used as a mask for exposing the printing plate is below 0.05.

A commonly used recording material is a silver halide photographic material that offers such advantages as high sensitivity, high density and good resolving power. However a silver halide photographic material requires special liquids for processing and as a consequence a lot of chemical waste is produced. Further silver halide photographic materials are susceptible to ambient light thus requiring handling in the dark.

Due to the above disadvantages of silver halide photographic material, especially the ecological disadvantage, the need for more convenient and ecologically more acceptable recording materials exists.

Especially interesting recording materials are heat mode recording materials because they are generally not susceptible to ambient light and can thus be handled in day light. Heat mode recording materials are disclosed in e.g. U.S. Pat. No. 4,123,309, U.S. Pat. No. 4,123,578, U.S. Pat. No. 4,157,412, U.S. Pat. No. 4,547,456 and PCT application WO 88/04237. The latter application discloses a web having an image forming surface and a porous layer of an image forming substance. The element further comprises a heat sensitive substance. Upon imaging with a laser the image forming surface is liquefied at the exposed parts thereby penetrating the porous layer and improving its adherence to the web while at the non-exposed parts liquefying of the image forming surface does not take place and as a consequence the adherence of the porous layer to the web remains poor. The porous layer can then be removed in the non-exposed areas using a stripping tape or by simply rubbing. Due to the subtle balance of adhesion forces between the porous layer and the image forming surface and the cohesive forces within the porous layer the removal of the porous layer with a stripping tape has to be performed under very stringent conditions and even then lateral cracks of the porous layer in the exposed parts may occur resulting in a decreased image density. The resulting image may be scratch sensitive and a protective layer should be laminated thereto which is inconvenient.

GB-A-2.029.267 discloses a heat mode recording material comprising on a support a metallic recording layer and a protective surface layer. Upon imaging with a laser the density of the metallic recording layer is reduced at the exposed areas due to melting of the metallic layer in these areas. Such a recording material is however unsuitable for imaging a printing plate because of the poor contrast and high fogging level of the image that is obtained.

In EP93201355 a heat mode recording material has been described containing on a support a heat mode recording layer of e.g. carbon black dispersed in a polymeric binder and on top thereof a surface layer. After imaging with a powerful laser, the recording material is rubbed to remove the recording layer and surface layer in the exposed areas. Although images of good quality are obtained, the minimum density of the images is still insufficient to use them as masks in the making of printing plates.

SUMMARY OF THE INVENTION

It is an object of the present invention to provide a heat mode recording material that can yield images of high density and contrast so that they can be used as masks for imaging a printing plate.

It is a further object of the present invention to provide a method for making images of high density and contrast by means of a heat mode recording material.

Further objects of the present invention will become clear from the description hereinafter.

According to the present invention there is provided a heat mode recording material comprising on a transparent support a recording layer containing a light to heat converting substance, an image forming substance and a binder characterised in that there is present a heat decomposable intermediate layer between said transparent support and said recording layer and said heat decomposable intermediate layer being contiguous to said recording layer.

According to the present invention there is provided a method for making an image comprising image-wise exposing a heat mode recording material as defined above to light and rubbing the heat mode recording material to remove the recording layer in the exposed areas.

DETAILED DESCRIPTION OF THE INVENTION

Due to the presence of the heat decomposable intermediate layer an image can be obtained that is practically free from fog i.e. of which the non-image density is practically zero. Consequently the obtained images are suitable for use as masks in the imaging of printing plates. With the term "heat decomposable" in connection with the present invention is meant that the intermediate layer at least partially decomposes and/or that the adhesion of the recording layer to the intermediate layer is reduced at the exposed areas.

As a heat decomposable intermediate layer in accordance with the present invention there can be used any polymeric layer that is readily decomposable at the temperature generated in the heat mode recording material. Depending on the type of the light source used and the exposure time the temperature generated in the heat mode recording material may reach 300° C. to 800° C. It will furthermore be clear that the decomposition of the intermediate layer may not yield colored reaction products remaining on the heat mode recording material after rubbing.

It has been found that a particular suitable polymer for use in the heat decomposable intermediate layer is an auto-oxidising polymer such as nitro-cellulose. It is furthermore preferred to harden the intermediate layer. Thus, according to the most preferred embodiment in connection with the present invention there is used a layer containing a hardened nitro-cellulose. Hardening of nitro-cellulose may be accomplished by means of an aromatic or aliphatic polyisocyanate, the latter being preferred.

The recording layer according to the present invention comprises a light to heat converting substance and an image forming substance. In an especially preferred embodiment the image forming substance and light to heat converting substance are the same substance. The light to heat converting substance in connection with the present invention is a compound that is capable of absorbing a substantial amount of the exposure radiation and subsequently releasing the associate energy mainly in the form of heat. Preferably the thickness of the heat mode recording layer is not more than 2.5 μm and most preferably not more than 1.5 μm. When the thickness of the recording layer becomes too large not all of the recording layer can be removed in the exposed areas so that a high fogging level results.

Suitable light to heat converting substances are e.g. carbon black, metals or metal alloys preferably having a low melting point and low conductivity e.g. Bi, Ge, Sn, Te etc., infrared or near infrared dyes as disclosed in e.g. U.S. Pat. No. 4,833,124, EP-321923, U.S. Pat. No. 4,772,583, U.S. Pat. No. 4,942,141, U.S. Pat. No. 4,948,776, U.S. Pat. No. 4,948,777, U.S. Pat. No. 4,948,778, U.S. Pat. No. 4,950,639, U.S. Pat. No. 4,950,640, U.S. Pat. No. 4,912,083, U.S. Pat. No. 4,952,552, U.S. Pat. No. 5,024,990, U.S. Pat. No. 5,023,229 etc. or infrared absorbing pigments such as e.g. HEUCODOR metal oxide pigments available from Heubach Langelsheim.

Suitable image forming substances to be used in accordance with the invention are substances that can yield sufficient density in the desired range of the spectrum, e.g. in the visual or in the UV part of the spectrum. Examples of image forming substances are e.g. dyes or dye pigments. In an especially preferred embodiment the image forming substance and light to heat converting substance are the same substance. Compounds that can be used as image forming substance and light to heat converting substance are e.g. carbon black or metals.

According to the most preferred embodiment of the present invention the recording layer is a layer containing carbon black and a polymeric binder preferably having a good thermal degradation. Examples of binders that can be used are e.g. gelatin, cellulose, cellulose esters e.g. cellulose acetate, nitrocellulose, polyvinyl alcohol, polyvinyl pyrrolidone, a copolymer of vinylidene chloride and acrylonitrile, poly(meth) acrylates, polyvinyl chloride, silicone resin etc. The recording layer may further contain other ingredients such as e.g. wetting agents, matting agents, antioxidizing agents etc.

The recording layer is preferably covered with a surface layer. Upon image-wise exposure to radiation a corresponding image-wise heat pattern will be formed in the recording layer due to the conversion of the radiation into heat by the light to heat converting substance. This heat pattern will cause image-wise decomposition of the recording layer and optionally of the surface layer that may be on top thereof. At the sufficiently exposed parts of the recording material the recording layer will be sufficiently decomposed so that the recording layer and optional surface layer can be easily removed at these parts by simply rubbing the recording material. The optional surface layer may also be decomposed due to the heat generated at the exposed parts, however this is not a requirement because the decomposition of the recording layer at the exposed parts can be sufficient to also remove the surface layer by rubbing.

The optional surface layer on top of the recording layer offers the advantage that no or little decrease of the density in the non-exposed parts occurs during rubbing which may otherwise occur as a consequence of possible damaging of the recording layer during rubbing.

The optional surface layer in accordance with the present invention preferably also contains a polymer that shows good thermal degradation. Examples of polymers that can be used in the surface layer are e.g. gelatin, cellulose, cellulose esters e.g. cellulose acetate, nitrocellulose, polyvinyl alcohol, polyvinyl pyrrolidone, a copolymer of vinylidene chloride and acrylonitrile, poly(meth) acrylates, polyvinyl chloride, a copolymer of styrene and butadiene, silicone resins etc. . . . Preferably used silicone resins are hardened silicone resins.

Preferably the silicone resin contains one or more components one of which is generally a linear silicone polymer terminated with a chemically reactive group at both ends and a multifunctional component as a hardening agent. The silicone resin can be hardened by condensation curing, addition curing or radiation curing.

Condensation curing can be performed by using a hydroxy terminated polysiloxane that can be cured with a multifunctional silane. Suitable silanes are e.g. acetoxy silanes, alkoxy silanes and silanes containing oxime functional groups. Generally the condensation curing is carried out in the presence of one or more catalyst such as e.g. tin salts or titanates. Alternatively hydroxy terminated polysiloxanes can be cured with a polyhydrosiloxane polymer in the presence of a catalyst e.g. dibutyltindiacetate.

Addition curing is based on the addition of Si—H to a double bond in the presence of a platinum catalyst. Silicone coatings that can be cured according to the addition curing thus comprise a vinyl group containing polymer, a platinum catalyst e.g. chloroplatinic acid complexes and a polyhydrosiloxane e.g. polymethylhydrosiloxane. Suitable vinyl group containing polymers are e.g. vinyldimethyl terminated polydimethylsiloxanes and dimethylsiloxane/vinylmethyl siloxane copolymers.

Radiation cure coatings that can be used in accordance with the present invention are e.g. U.V. curable coatings containing polysiloxane polymers containing epoxy groups or electron beam curable coatings containing polysiloxane polymers containing (meth)acrylate groups. The latter coatings preferably also contain multifunctional (meth) acrylate monomers.

The surface layer may contain additional substances such as plasticizers, pigments, matting agents, anti-statica etc. Part of the light to heat converting substance may also be incorporated in the surface layer.

The thickness of the surface layer is preferably between 0.1 μm and 3 μm and more preferably between 0.1 μm and 1 μm.

When the recording material comprises a recording layer and surface layer the total thickness thereof is preferably kept as low as possible. By keeping the layer thickness at a low level the imaged parts of the recording material can be more easily removed and further the sharpness and resolution of the image can be improved in this way. Preferably the total thickness will not exceed 7 μm and most preferably will not exceed 5 μm.

The heat mode recording material used in accordance with the invention may contain additional layers such as e.g. one or more layers between the support and the heat decomposable intermediate layer for improving the adhesion thereof to the support.

According to a special embodiment of the present invention there may be provided a further image forming layer on top of the recording layer in order to increase the density of the image. A particularly suitable layer for this purpose is a vapour deposited metal layer such e.g. a layer of bismuth, silver, aluminium etc. . . .

According to a pratical embodiment of the present invention a peelable polymeric film may be provided on top of the recording layer or on top of the surface layer when present. Such polymeric film avoids contamination of the exposure device by parts of the recording material that may otherwise be ablated during exposure. The polymeric film is removed after an image has been formed on the recording material. The polymeric film further avoids the occurence of electric discharges when taking a recording material out of a pile. To further reduce such discharge the peelable polymeric film may be given an antistatic treatment.

Suitable polymeric films for use in accordance with the present invention are e.g. polyester, polycarbonate or polystyrene film, cellulose derivatives, polyolefines, polyvinylchloride, etc. Preferably the peelable polymeric film is metallized or it may be a polymeric film being pigmented with a conductive pigment such as e.g. carbon black, a metal or metal oxide etc. Preferably the peelable polymeric film has a thickness between 3 μm and 100 μm and more preferably between 10 μm and 50 μm. A thin peelable polymeric film offers the advantage that it can be laminated to the recording material without the aid of an adhesive and that it can be easily removed afterwards. However, the peelable polymeric film in connection with the present invention may also be laminated to the recording material using an adhesive provided the adhesive does not cause adverse effects on the imaging properties of the recording material or damage when peeled off.

Suitable transparent supports for the heat mode recording material used in connection with present invention are e.g. a polyester film support, polycarbonate film, polystyrene film etc. The thickness of the support is preferably between 0.1 mm and 0.35 mm.

According to the method of the present invention the heat mode recording material is image-wise exposed to light, preferably through the support of the recording material and subsequently rubbed to remove the recording layer and optional surface layer at the exposed parts. The exposure is preferably accomplished using a laser. Preferably used lasers are e.g. semiconductor lasers, YAG lasers e.g. Nd-YAG lasers, Argon lasers etc. The laser may have a power output between 40 and 7500 mW and preferably operates in the infrared part of the spectrum.

Rubbing in connection with the present invention is preferably carried in two steps. In a first step the recording material may be rubbed e.g. by means of a brush under essentially dry conditions, without the aid of a liquid, to remove the exposed areas. In a second step a liquid that does not swell the recording layer may be used to take away any residual dust that may still be present. A particular suitable liquid for this purpose in case the recording layer and/or the surface layer is hydrophobic is water optionally containing a detergent.

According to the present invention the image obtained according to the above described method can be used as an original for imaging a lithographic printing plate.

Thus a lithographic printing plate precursor containing an oleophobic or oleophilic base is imaged using as an original an image obtainable by the above described method so that an image-wise pattern of respectively oleophilic or oleophobic parts is formed on the oleophobic or oleophilic background. Exposure may take place through the support of the imaged recording material being in contact with the lithographic printing plate precursor.

According to a practical embodiment of the present invention for obtaining a lithographic printing plate, a plate precursor containing an aluminium support carrying on a hydrophilic (oleophobic) surface a photosensitive coating of e.g. a photopolymerizable composition or a diazo resin etc. is exposed to actinic radiation in contact with an imaged heat mode recording material of the present invention and is subsequently developed so that an image-wise pattern of oleophilic parts remains on the oleophobic background. Such type of printing plate precursors are described in e.g. EP-A-450199, EP-A-476187, U.S. Pat. No. 3,971,660, EP-A-167751, EP-A-48909, DE-A-3036174, DE-A-3717757, DE-A-3228429, U.S. Pat. No. 4,268,667.

According to another embodiment of the invention for obtaining a lithographic printing plate a silver salt diffusion transfer plate precursor containing a silver halide photosensitive layer and an image receiving layer is camera or contact exposed using an imaged heat mode recording material of the present invention and is subsequently developed according to the silver salt diffusion transfer process. Such type of printing plate precursors are described in e.g. EP-A-410500, EP-A-474922, U.S. Pat. No. 4,297,429.

The present invention will now be illustrated by the following examples without however limiting the invention thereto. All parts are by weight unless otherwise specified. The optical densities listed in the examples were measured with a McBeth TR924 visible light densitometer. The polyester base was used as the reference when measuring optical densities.

EXAMPLE 1

To a polyethylene terephthalate support was coated a dispersion for the recording layer according to following composition:

| | | |
|---|---|---|
| 168.0 g | n-butanone | |
| 6.0 g | nitrocellulose E510 | (1) |
| 23.7 g | carbon black Special Schwarz 250 | (2) |
| 1.9 g | Solsperse 24000 | (3) |
| 0.47 g | Solsperse 5000 | (4) |

(1) E510 (tradename) is a medium molecular nitrocellulose, supplier Wolff Walsode Co.
(2) Special Schwarz 250 (tradename) is a carbon black from Degussa
(3) Solsperse 24000 (tradename) is a wetting agent from ICI
(4) Solsperse 5000 (tradename) is a wetting agent from ICI The recording layer was applied at a dry coating weight of about 1.5 g/m2, corresponding to an optical density of about 3.0.

To this recording layer was then coated following coating composition for a surface layer:

| | | |
|---|---|---|
| 651 g | EXXSOL DSP 80/110 | (5) |
| 20.5 g | PS 255 | (6) |

-continued

| | | |
|---|---|---|
| 43.4 g | PS 447.6 | (7) |
| 1.8 g | SYL-OFF 7367 | (8) |
| 0.3 g | PC 072 | (9) |

(5) Exxsol DSP 80/110 (tradename) is a nahptha i.e. mixture of paraffins and in which the content of aromatics has been reduced, supplier Exxon Chemicals.
(6) PS 255 (tradename) is a poly(dimethylsiloxane/methylvinylsiloxane) copolymer, gum, from Huls.
(7) PS 447.6 (tradename) is a vinyldimethyl terminated polydimethylsiloxane with a viscosity of 65,000 ctsk., molecular weight about 119,000 from Huls
(8) Syl-Off 7367 (tradename) is the cross-linker used and is a solution of 71% of methyl hydrogen polysiloxane in ethynylcyclohexene, from Dow Corning
(9) PC 072 (tradename) is a divinyltetramethyl disiloxane complex of platinum in xylene, supplier Huls.

The surface layer coating composition was coated on the recording layer to a dry coating weight of 2.0 g/m2 to obtain an oleophobic top layer. Subsequent the surface layer was cured for 5 min. at 130° C.

The thus prepared heat mode recording material was image-wise exposed through the support with a Nd-YLF laser (1053 nm) at a linear writing speed of 32.8 m/s, with a spot diameter of (1/e2) and a power output at the surface of the recording material of 1600 mW. After imaging, the recording layer together with the surface layer were image-wise removed by rubbing with a dry cotton pad. The obtained image portions were post-cleaned with a cotton pad wetted with a 1% aqueous dilution of a commercial detergent.

The image portions showed a residual optical density of 0.05.

EXAMPLE 2

To a polyethylene terephthalate support was coated a base coat layer according following composition:

| | | |
|---|---|---|
| 100 g | n-butanone | |
| 10.0 g | nitrocellulose E510 | (1) |
| 6.7 g | Desmodur N75 | (10) |
| 0.3 g | Siccatol ZN12 | (11) |

(10) Desmodur N75 (tradename) is an aliphatic polyisocyanate crosslinking agent solution (75% solids) recommend for application in clear non yellowing coatings, supplier Bayer.
(11) Siccatol ZN12 (tradename) is a 12% Zn-octanoate solution (catalyst) supplied by Akzo.

The base coat was applied to a dry coating weight about 1.0 g/m2 and cured for 10 min. at 120° C.

To this base coat was then coated the coating composition from example 1 for the recording layer to obtain a coating showing an optical density of 3.7.

To the recording layer was then coated the composition for the surface layer described in example 1 to a dry coating weight of about 2.0 g/m2. Subsequent the surface layer was cured for 5 min. at 130° C.

The thus prepared heat mode recording material was image-wise exposed through the backside with a Nd-YLF laser (1053 nm) at a linear writing speed of 32.8 m/s, with a spot diameter of (1/e2) and a power output at the surface of the recording material of 1600 mW. After imaging, the recording layer together with the surface layer were image-wise removed by rubbing with a dry cotton pad. The obtained image portions were post-cleaned with a cotton pad wetted with a 1% dilution of a commercial detergent.

The image portions showed a very low residual optical density of 0.02. (measured with a McBeth TR924-visible light densitometer) towards the uncoated polyester base taken as reference.

EXAMPLE 3

To a polyethylene terephthalate support was coated a base coat layer according to example 2.

To the base coat was coated a dispersion for the recording layer according following composition:

| | | |
|---|---|---|
| 168.00 g | n-butanone | |
| 6.0 g | nitrocellulose E510 | |
| 23.7 g | carbon black Special Schwarz 250 | |
| 1.9 g | Solsperse 24000 | |
| 0.47 g | Solsperse 5000 | |
| 0.2 g | 10% solution of Tegoglide 410 | (12) |

(12) Tegoglide 410 (tradename) is an alkylene siloxane

The thus prepared heat mode recording material was image-wise exposed through the backside with a Nd-YLF laser (1053 nm) at a linear writing speed of 32.8 m/s, with a spot diameter of (1/e2) and a power output at plate level of 1600 mW. After imaging the recording layer was image wise removed by rubbing with a dry cotton pad. The obtained image portions were post-cleaned with a cotton pad wetted with a 1% aqueous dilution of a commercial detergent.

The image portions showed a very low residual optical density of 0.02.

EXAMPLE 4

To a polyethylene terephthalate support was coated a base coat layer according to example 2.

To the base coat was coated a dispersion for the recording layer according the composition of example 1 to a dry coating weight according to an optical density of about 2.

To the recording layer was vacuum deposited a bismuth layer such that the resulting optical density of the carbon black based recording layer together with the metallic layer was 4.5.

To the recording layer was then coated the composition for the surface layer described in example 1 to a dry coating weight of about 2.0 g/m2. Subsequent the surface layer was cured for 5 min. at 130° C.

The thus prepared heat mode recording material was image-wise exposed through the backside with a Nd-YLF laser (1053 nm) at a linear writing speed of 32.8 m/s, with a spot diameter of (1/e2) and a power output at the surface of the heat mode recording material of 1600 mW. After imaging, the recording layer together with the metallic layer and the surface layer were image-wise removed by rubbing with a dry cotton pad. The obtained image portions were post-cleaned with a cotton pad wetted with a 1% aqueous dilution of a commercial detergent.

The image portions showed a very low residual optical density of 0.01.

I claim:

1. A heat mode recording material comprising on a transparent support a recording layer containing a light to heat converting substance, an image forming substance and a binder and wherein there is present a hardened heat decomposable intermediate layer between said transparent support and said recording layer, said hardened heat decomposable intermediate layer being contiguous to said recording layer.

2. A heat mode recording material according to claim 1 wherein said heat decomposable intermediate layer contains nitro-cellulose.

3. A heat mode recording material according to claim 2 wherein said nitro-cellulose is hardened by means of a polyisocyanate.

4. A heat mode recording material according to claim 1 further comprising a surface layer on top of said recording layer.

5. A heat mode recording material according to claim 1 wherein said light-to-heat converting substance and said image forming substance are the same.

6. A heat mode recording material according to claim 5 wherein said light-to-heat converting substance and image forming substance are carbon black.

* * * * *

Disclaimer and Dedication 5,536,619—Yves Verburgh, Begijnendijk, Belgium. HEAT MODE RECORDING MATERIAL. Patent dated July 16, 1996. Disclaimer and Dedication filed April 24, 1997, by the assignee, AGFA-Gevaert, N.V.

Hereby disclaims and dedicates to the public the remaining term of said patent.

*(Official Gazette,* August 26, 1997)